(12) United States Patent
Tabuchi et al.

(10) Patent No.: US 8,585,436 B2
(45) Date of Patent: Nov. 19, 2013

(54) CARD AND CONNECTING DEVICE

(76) Inventors: Atsushi Tabuchi, Kobe (JP); Inagi Tsutai, Kobe (JP)

( * ) Notice: Subject to any disclaimer, the term of this patent is extended or adjusted under 35 U.S.C. 154(b) by 21 days.

(21) Appl. No.: 13/061,481

(22) PCT Filed: Aug. 29, 2008

(86) PCT No.: PCT/JP2008/002363
§ 371 (c)(1),
(2), (4) Date: Apr. 21, 2011

(87) PCT Pub. No.: WO2010/023711
PCT Pub. Date: Mar. 4, 2010

(65) Prior Publication Data
US 2011/0201235 A1    Aug. 18, 2011

(51) Int. Cl.
*H01R 29/00* (2006.01)
(52) U.S. Cl.
USPC .............................. 439/516; 439/55; 439/951
(58) Field of Classification Search
USPC .............................. 439/55, 951, 516, 637, 638
See application file for complete search history.

(56) References Cited

U.S. PATENT DOCUMENTS

| | | | |
|---|---|---|---|
| 4,592,606 A * | 6/1986 | Mudra | 439/516 |
| 5,325,267 A * | 6/1994 | Ewing | 361/760 |
| 6,179,664 B1 * | 1/2001 | Tung et al. | 439/633 |
| 6,666,705 B1 * | 12/2003 | Lauruhn et al. | 439/377 |
| 6,913,470 B1 * | 7/2005 | Lafleur | 439/71 |
| 7,255,570 B1 | 8/2007 | Feldman et al. | |
| 7,385,665 B2 * | 6/2008 | Matsumoto | 349/150 |
| 2006/0160414 A1 * | 7/2006 | Chou et al. | 439/541.5 |
| 2007/0254526 A1 * | 11/2007 | Lai et al. | 439/637 |

FOREIGN PATENT DOCUMENTS

| | | |
|---|---|---|
| CN | 1956265 A | 5/2007 |
| CN | 1988267 A | 6/2007 |
| JP | 183359 U | 6/1989 |
| JP | 2002271059 A | 9/2002 |
| JP | 2004259809 A | 9/2004 |
| JP | 3123421 U | 6/2006 |
| JP | 2007172580 A | 5/2007 |

OTHER PUBLICATIONS

International Search Report and Written Opinion for PCT/JP2008/002363 dated May 11, 2009.
Notice of Reasons for Rejection issued Sep. 4, 2012 in Japanese Patent Application No. 2011-509747.
Abstract of JP 2004-259809 dated Sep. 16, 2004.
Abstract of JP 2002-271059 dated Sep. 20, 2002.
Abstract of JP 2007-172580 dated Jul. 5, 2007.
Abstract pf JP-U-3123421 dated Jun. 21, 2006.
Office Action and Examiner Search Report for Chinese Application No. 200880131758.1 dated Oct. 23, 2012.

\* cited by examiner

*Primary Examiner* — Gary F. Paumen
(74) *Attorney, Agent, or Firm* — Arent Fox LLP

(57) ABSTRACT

A card (1) to be mechanically connected with a socket (21, 22, 23, 24, 25) of an interface bus of a type selectable from among a plurality of bus widths. The card (1) includes an electrical connection portion (150) to be electrically connected with the socket of the interface bus, and a connection reinforcing portion (170) to reinforce a mechanical connection with the socket of the interface bus, wherein the connection reinforcing portion (170) is at least partially removable.

10 Claims, 6 Drawing Sheets

CARD AND CONNECTING DEVICE

TECHNICAL FIELD

The present invention relates to a card and a connecting device that ensure a highly reliable electrical connection between an interface bus and an electronic device, and in particular, to a card and a connecting device capable of ensuring a highly reliable electrical connection between an interface bus of various types and an electronic device.

BACKGROUND ART

At present, the PCI (Peripheral Component Interconnect) Express specification is being widely adopted as an interface bus specification after the PCI specification for connecting various kinds of component elements that constitute a computer and various kinds of peripheral devices. With the PCI Express specification unlike the traditional PCI specification, a serial interface that realizes sequential data transmission using point-to-point interconnection between devices is implemented.

The smallest unit for a transmission path used in the PCI Express 1.1 specification is called a "lane", through which the full duplex transmission of 2.5 Gbps in simplex mode and 5.0 Gbps in duplex mode is possible. In order to transmit 8-bit data, the data needs to be expanded by two bits for clock recovery and converted into 10-bit data, and therefore, an effective data transfer rate is 2.0 Gbps (250 MB/s) in simplex mode and 4.0 Gbps (500 MB/s) in duplex mode.

An actually used socket compliant with the PCI Express specification, into which a detachable adapter card is inserted, is often constituted from more than one lane. A PCI Express socket that is constituted from a single lane is called a "PCI Express ×1", and a PCI Express socket that is constituted from n lanes is called a "PCI Express ×n". Today, products with sockets of ×1, ×4, ×8, ×16, and the like are available. While the data transfer rate with the PCI Express 1.1 specification in simplex mode is up to 4 GB/s for PCI Express ×16 and 8 GB/s for ×2, PCI Express 2.0 with which transmission speed per lane is doubled has been recently released, and further improvement in performance is expected in the future.

The PCI Express configuration has successfully decreased the number of connecting terminals at the same transfer rate as that of the PCI by adopting a high-speed serial transmission method, and has realized a higher transfer rate by increasing the number of lanes. Further, the PCI Express has flexibility in that data can be correctly transferred between a socket and an adapter card if the number of lanes for the socket is greater than, even if not equal to, that for the adapter card.

DISCLOSURE OF INVENTION

Problems to be Solved by the Invention

Conventional PCI buses guarantee proper operation in any combination of 32-bit bus devices and sockets as well as 64-bit bus devices and sockets. However, with the PCI Express specification, there are cases where a physical problem may occur when an adapter card of a certain lane specification is inserted into a socket of a different lane specification. For example, there is a problem when inserting a 1-lane adapter card 100 into a 16-lane socket 200 as shown in FIG. 9, in that the fit between the adapter card 100 and the socket 200 becomes loose because the adapter card 100 fitting into the socket is short in length and a latch lever 200a cannot be used, and therefore reliability in electrical and physical connectivity between an electronic device or an electronic part in which the adapter card 100 is installed and an interface bus that constitutes the socket 200, can be impaired.

In particular, using an adapter card having a smaller number of lanes, such as a 1-lane, 4-lane, or 8-lane adapter card, can often cause mechanical problems in that fitting strength of the adapter card into the socket is weaker and the adapter card becomes susceptible to falling out of the socket because the length of the connecting part of the adapter card fitting directly into the socket is shorter, and that flexure or deformation of the adapter card may occur due to insufficient rigidity of the adapter card in addition to vibration and the adapter card's own weight. These problems can often impair reliability in electrical connections between an electronic part on the adapter card and an interface bus, as well as reliability in electrical operation of the adapter card itself.

A device called a retainer is sometimes used to fix the adapter card and a housing containing the adapter card in order to prevent the above problems from occurring, but using a retainer increases the overall cost. This also limits options for the housing because it is necessary to provide the housing with a mechanism for attaching the retainer, leading to increased cost Japanese Unexamined Patent Application Publication No. 2007-172580 discloses an example of a new aspect added to the form of a socket, in which a socket compliant with the PCI Express specification is provided with an opening at one end so that an adapter card having more lanes than the socket can be connected with the socket. However, because providing an opening does not change the length of the fitting portion between the socket and an adapter card, this does not ensure the strength of the mechanical connection or the reliability of the electrical connection. Further, U.S. Pat. No. 7,255,570 discloses providing a brace member for an adapter card compliant with the PCI Express specification. However, this brace member is provided for the adapter card in order to prevent the fitting portion between the adapter card and the socket from being inclined, and does not improve the reliability of the connection sufficiently by providing additional strength to the mechanical connection between the adapter card and the socket. Moreover, because lane specifications and substrate forms for sockets are different from product to product, each adapter card for the PCI Express specification needs to have a unique structure for a corresponding product, thus making it difficult to ensure a highly reliable connection between an electronic device and an interface bus and to reduce the cost at the same time.

As described above, connecting devices are needed such as an adapter card capable of ensuring a highly reliable electrical connection of an electronic device with an interface bus, at low cost and without complicating the configuration of the adapter card even though the type such as a socket lane specification of the interface bus may be different.

It is, therefore, an object of the present invention to provide a card and a connecting device capable of ensuring a highly reliable electrical connection of an electronic device with an interface bus at low cost and without complicating the configuration, even with interface buses of different types.

Means for Solving the Problems

In accordance with a first aspect of the present invention, there is provided a card to be mechanically connected with a socket of an interface bus of a type selectable from among a plurality of bus widths, the card including: an electrical connection portion to be electrically connected with the socket of the interface bus; and a connection reinforcing portion to reinforce a mechanical connection with the socket of the interface bus, wherein the connection reinforcing portion is at least partially removable.

With this configuration, since the card includes an electrical connection portion to be electrically connected with the socket of the interface bus, and a connection reinforcing portion to reinforce a mechanical connection with the socket of the interface bus, in which the connection reinforcing portion is at least partially removable according to type such as bus width of the interface bus to be connected, the card according to the present invention can ensure a highly reliable electrical connection of the electronic device with the interface bus at low cost and without complicating the configuration even if the type of the interface bus is different.

Further, according to the present invention, the connection reinforcing portion may include a fitting portion capable of being selectively fitted into the socket of the interface bus and removed.

With this configuration, the card according to the present invention can ensure a highly reliable electrical connection of the electronic device with the interface bus at low cost and without complicating the configuration even if the type of the interface bus is different, since the connection reinforcing portion can be selectively fitted into the socket of the interface bus and removed according to the type such as a bus width of the interface bus to be connected.

Further, according to the present invention, the connection reinforcing portion may include an engagement portion that can be selectively engaged with the socket of the interface bus and removed.

With this configuration, the card according to the present invention can ensure a highly reliable electrical connection of the electronic device with the interface bus at low cost and without complicating the configuration even if the type of the interface bus is different, since the engagement portion can be selectively fitted into the socket of the interface bus and removed according to the type such as a bus width of the interface bus to be connected.

Further, according to the present invention, the connection reinforcing portion may be removable by breaking along a break line.

With this configuration, the card according to the present invention can easily ensure a highly reliable electrical connection of the electronic device with the interface bus at low cost and without complicating the configuration even if the type of the interface bus is different, since the connection reinforcing portion is removable by breaking along a break line.

Further, the connection reinforcing portion may be formed with an opening into which a member can be inserted.

With this configuration, the card according to the present invention can easily ensure a highly reliable electrical connection of the electronic device with the interface bus at low cost and without complicating the configuration even if the type of the interface bus is different, since the connection reinforcing portion can be easily removed along the break line with a tool such as a screwdriver.

Further, according to the present invention, the card may further include an abutting portion which abuts a part of housing that accommodates the card, so as to reinforce a mechanical connection with a socket of the interface bus.

With this configuration, the card according to the present invention can ensure a highly reliable electrical connection of the electronic device at low cost and without complicating the configuration since the mechanical connection with the electronic device can be further reinforced.

Further, according to the present invention, the electrical connection portion and the connection reinforcing portion may be substantially in alignment with each other along an edge of the card.

With this configuration, the card according to the present invention can ensure a highly reliable electrical connection of the electronic device at low cost and without complicating the configuration since the electrical connection portion and the connection reinforcing portion can be placed substantially in alignment with each other.

Further, according to the present invention, the interface bus may be compliant with the PCI Express specification and the plurality of bus widths may include a 1-lane type interface bus width, a 4-lane type interface bus width, an 8-lane type interface bus width, and a 16-lane type interface bus width. In addition, the interface bus may be compliant with the PCI specification and the plurality of bus widths may include a 32-bit bus width and 64-bit bus width.

In accordance with a second aspect of the present invention, there is provided a connecting device to be mechanically connected with a socket of an interface bus of a type selectable from among a plurality of bus widths, the connecting device including: an electrical connection portion to be electrically connected with the socket of the interface bus, and a connection reinforcing portion to reinforce a mechanical connection with the socket of the interface bus, wherein the connection reinforcing portion is at least partially removable.

With this configuration, since the connecting device includes an electrical connection portion to be electrically connected with the socket of the interface bus, and a connection reinforcing portion to reinforce a mechanical connection with the socket of the interface bus, in which the connection reinforcing portion is at least partially removable according to type such as a bus width of the interface bus to be connected, the connecting device according to the present invention can ensure a highly reliable electrical connection of the electronic device with the interface bus at low cost and without complicating the configuration even if the type of the interface bus is different.

DETAILED DESCRIPTION

The following describes embodiments of a connecting device according to the present invention, with reference to the drawings.

First Embodiment

Firstly, a first embodiment of a connecting device according to the present invention is described with reference to FIG. 1 to FIG. 5.

Figure 1:
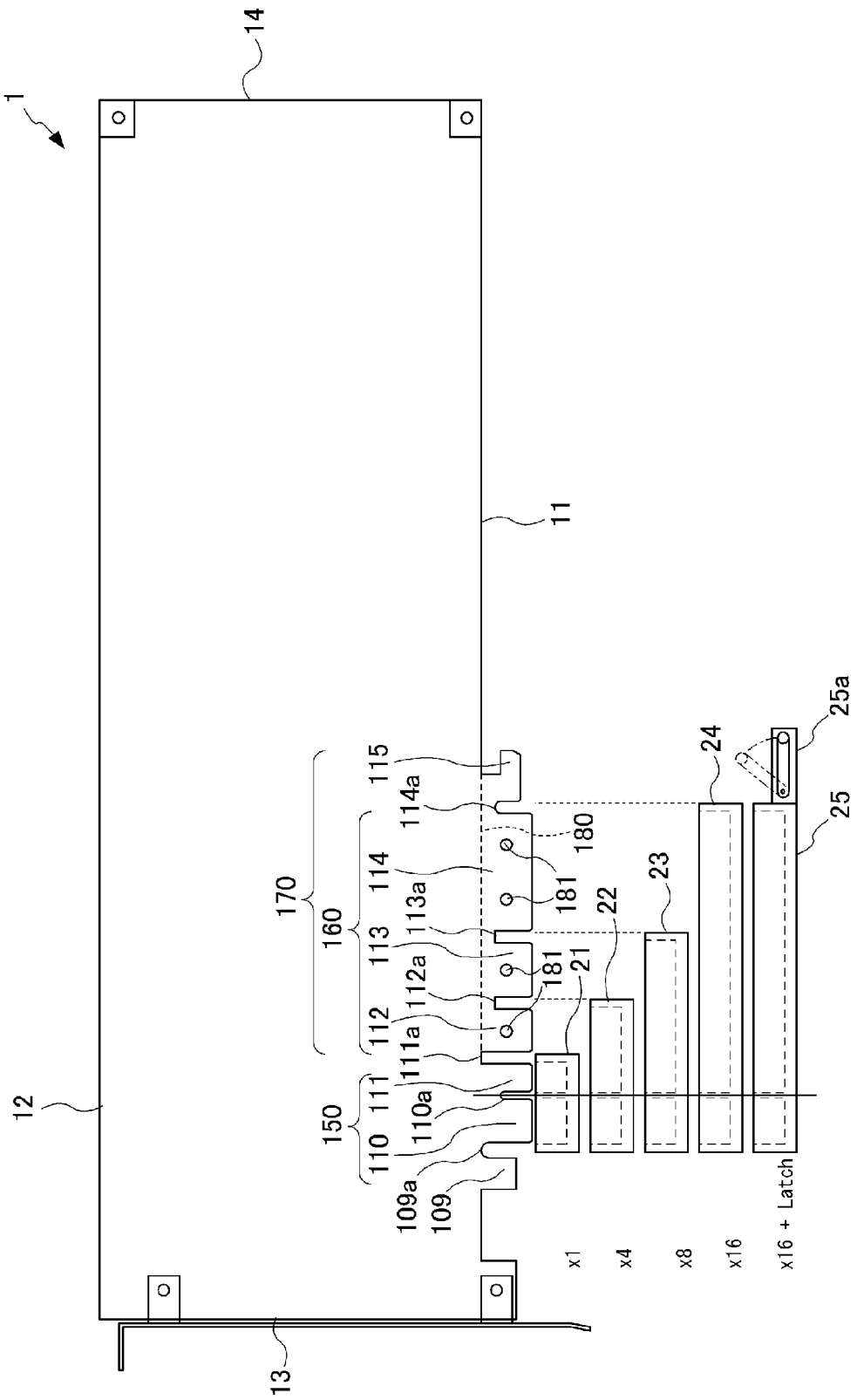
FIG. 1 is a view showing a first embodiment of a connecting device according to the present invention, facing toward various types of interface bus sockets.

Referring to FIG. 1, a configuration of a first embodiment of a 1-lane connecting device 1 according to the present invention is described.

1-Lane Type Connecting Device

As shown in FIG. 1, for example, the connecting device 1, constituted as an adapter card mounting an electronic device or electronic parts, includes a bottom edge 11, a top edge 12, a leading edge 13, and a trailing edge 14. The bottom edge 11 is provided with a protrusion 109, contacts 110 and 111 that fit into a socket in an interface bus (not depicted) to electrically connect the interface bus and the electronic device (not depicted), dummy contacts 112, 113, and 114 that fit into the socket in the interface bus and provide additional strength to mechanical connection with the interface bus without providing electrical connection between the interface bus and the electronic device, and an engagement portion 115 that engages with a latch portion in the interface bus to provide additional strength to mechanical connection with the interface bus. Further, a first insection 109a is provided between the protrusion 109 and the contact 110, a second insection 110a is provided between the contacts 110 and 111, a third insection 111a is provided between the contact 111 and the dummy contact 112, a fourth insection 112a is provided between the dummy contacts 112 and 113, a fifth insection 113a is provided between the dummy contacts 113 and 114, and a sixth insection 114a is provided between the dummy contact 114 and the engagement portion 115. The contacts 110 and 111 constitute an electrical connection portion 150, and the dummy contacts 112-114 constitute a fitting portion 160. Moreover, the connecting device 1 is provided with a break line 180, and a portion, where the fitting portion 160 and the engagement portion 115 are provided, can be removed as required by breaking along the break line 180. The break line 180 may be a perforated line, or a cut-in line constituted by a groove having a V-shaped cross-section. The fitting portion 160 is provided with an opening 181 so that the breaking of the relevant portion can be easily done along the break line 180 by inserting a rod-shaped member or a tool such as a screwdriver into the opening 181, and using leverage.

Further, the dummy contacts 112-114 and the engagement portion 115 together constitute a connection reinforcing portion 170. Further, additional strength to the mechanical connection with the interface bus may be provided by bringing one or both of the leading edge 13 and the trailing edge 14 of the connecting device 1 into abutting contact with a part of a housing portion (not depicted) that accommodates the interface bus, or, for example, by screwing the same to the housing portion. In this case, according to the shape of the corresponding interface bus, one or both of the leading edge 13 and the trailing edge 14 abutting the housing portion constitute(s) an abutting portion.

For ease of understanding, FIG. 1 shows a socket 21 in a 1-lane interface bus, a socket 22 in a 4-lane interface bus, a socket 23 in a 8-lane interface bus, a socket 24 in a 16-lane interface bus, and a socket 25 in a 16-lane interface bus with a latch portion 25a respectively facing toward the present embodiment of the connecting device 1. When the connecting device 1 is connected with the socket in the interface bus, the electrical connection portion 150, the fitting portion 160, and the engagement portion 115 are provided substantially in alignment with each other along the bottom edge 11 facing toward the socket in the interface bus.

Next, the following describes connection between the present embodiment of the connecting device 1 and the interface bus of each type, with reference to FIGS. 2A to 2E in addition to FIG. 1.

Figure 2A:
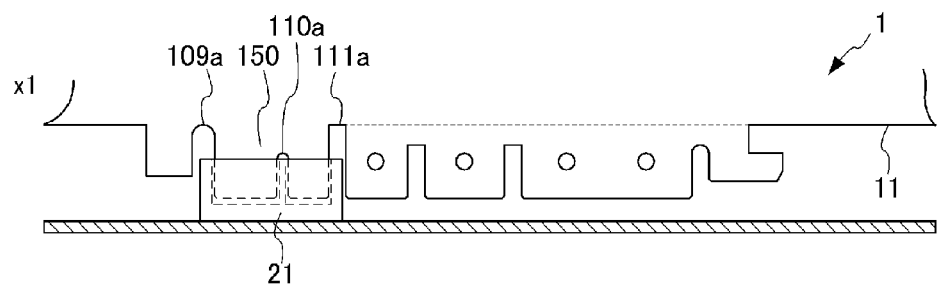
FIG. 2A is a view showing connecting states between the connecting device shown in FIG. 1 and a 1-lane interface bus socket.

Referring to FIG. 2A, the connection between the connecting device 1 and the 1-lane interface bus is described. As shown in FIG. 2A, the electrical connection portion 150 of the connecting device 1 fits into the socket 21 in the 1-lane interface bus, and, at the same time, the connecting device 1 electrically connects the interface bus and the electronic device through the electrical connection portion 150. When the connecting device 1 is inclined, the insections 109a, 110a, and 111a bring an end of the protrusion formed within the socket 21 and an end of an inner edge of the socket 21 into contact with ends of the insections 109a, 110a, and 111a of the connecting device 1, and thus the connecting device 1 becomes resistant to falling out of the socket 21. Further, although not shown in the drawings, additional strength to the mechanical connection with the interface bus may be provided by bringing one or both of the leading edge 13 and the trailing edge 14 of the connecting device 1 into abutting contact with a part of a housing portion (not depicted) that accommodates the interface bus, or, for example, by screwing the same to the housing portion. As described above, the mechanical connection between the connecting device 1 and the socket 21 in the interface bus is ensured with high reliability.

Figure 2B:
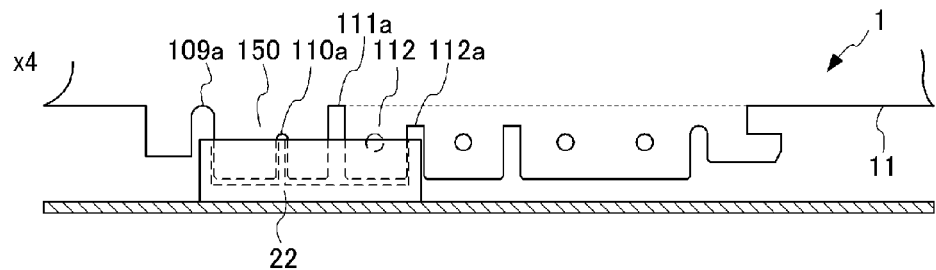
FIG. 2B is a view showing connecting states between the connecting device shown in FIG. 1 and a 4-lane interface bus socket.

Referring to FIG. 2B, the connection between the connecting device 1 and the 4-lane interface bus is described. As shown in FIG. 2B, the electrical connection portion 150 and the dummy contact 112 of the connecting device 1 fit into the socket 22 in the 4-lane interface bus, and at the same time, the connecting device 1 electrically connects the interface bus and the electronic device through the electrical connection portion 150. The connecting device 1 is additionally provided with the dummy contact 112, in addition to the electrical connection portion 150, as a part that fits into the socket 22. This increases rigidity of the connecting device 1 in a vertical direction, and makes the adapter card resistant to flexure due to vibration of the connecting device 1 in a vertical direction and the adapter card's own weight when the connecting device 1 is positioned flat. When the connecting device 1 is inclined, the insections 109a, 110a, and 112a bring an end of the protrusion formed within the socket 22 and an end of an inner edge of the socket 22 into contact with ends of the insections 109a, 110a, and 112a of the connecting device 1, and thus the connecting device 1 becomes resistant to falling out of the socket 22. Further, although not shown in the drawings, additional strength to the mechanical connection with the interface bus may be provided by bringing one or both of the leading edge 13 and the trailing edge 14 of the connecting device 1 into abutting contact with a part of a housing portion (not depicted) that accommodates the interface bus, or, for example, by screwing the same to the housing portion. As described above, the mechanical connection between the connecting device 1 and the socket 22 in the interface bus is ensured with high reliability.

Figure 2C:
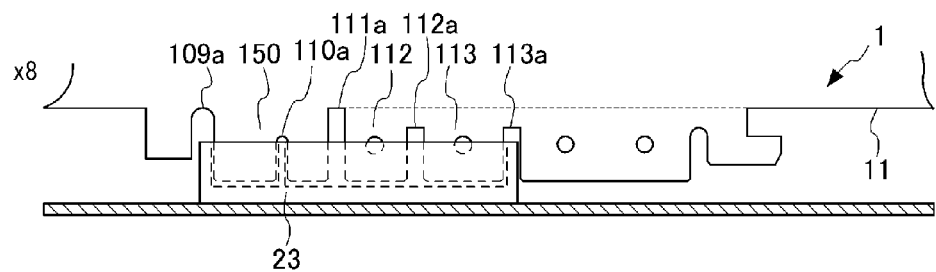
FIG. 2C is a view showing connecting states between the connecting device shown in FIG. 1 and a 8-lane interface bus socket.

Referring to FIG. 2C, the connection between the connecting device 1 and the 8-lane interface bus is described. As shown in FIG. 2C, the electrical connection portion 150 and the dummy contacts 112, 113 of the connecting device 1 fit into the socket 23 in the 8-lane interface bus, and, at the same time, the connecting device 1 electrically connects the interface bus and the electronic device through the electrical connection portion 150. The connecting device 1 is additionally provided with the dummy contacts 112, 113, in addition to the electrical connection portion 150, as parts that fit into the socket 23. This increases rigidity of the connecting device 1 in a vertical direction, and makes the adapter card resistant to flexure due to vibration of the connecting device 1 in a vertical direction and the adapter card's own weight when the connecting device 1 is positioned flat. When the connecting device 1 is inclined, the insections 109a, 110a, and 113a bring an end of the protrusion formed within the socket 23 and an end of an inner edge of the socket 23 into contact with ends of the insections 109a, 110a, and 113a of the connecting device 1, and thus the connecting device 1 becomes resistant to falling out of the socket 23. Further, although not shown in the drawings, additional strength to the mechanical connection with the interface bus may be provided by bringing one or both of the leading edge 13 and the trailing edge 14 of the connecting device 1 into abutting contact with a part of a housing portion (not depicted) that accommodates the interface bus, or, for example, by screwing the same to the housing portion. As described above, the mechanical connection between the connecting device 1 and the socket 23 in the interface bus is ensured with high reliability.

Figure 2D:
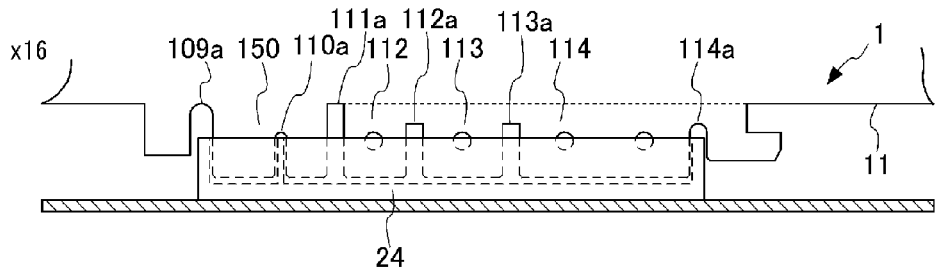
FIG. 2D is a view showing connecting states between the connecting device shown in FIG. 1 and a 16-lane interface bus socket with a latch portion.

Referring to FIG. 2D, the connection between the connecting device 1 and the 16-lane interface bus is described. As shown in FIG. 2D, the electrical connection portion 150 and the dummy contacts 112, 113, and 114 of the connecting device 1 fit into the socket 24 in the 16-lane interface bus, and, at the same time, the connecting device 1 electrically connects the interface bus and the electronic device through the electrical connection portion 150. The connecting device 1 is additionally provided with the dummy contacts 112, 113, and 114, in addition to the electrical connection portion 150, as parts that fit into the socket 24. This increases rigidity of the connecting device 1 in a vertical direction, and makes the adapter card resistant to flexure due to vibration of the connecting device 1 in a vertical direction and the adapter card's own weight when the connecting device 1 is positioned flat. When the connecting device 1 is inclined, the insections 109a, 110a, and 114a bring an end of the protrusion formed within the socket 24 and an end of an inner edge of the socket 24 into contact with ends of the insections 109a, 110a, and 114a of the connecting device 1, and thus the connecting device 1 becomes resistant to falling out of the socket. Further, although not shown in the drawings, additional strength to the mechanical connection with the interface bus may be provided by bringing one or both of the leading edge 13 and the trailing edge 14 of the connecting device 1 into abutting contact with a part of a housing portion (not depicted) that accommodates the interface bus, or, for example, by screwing the same to the housing portion. As described above, the mechanical connection between the connecting device 1 and the socket 24 in the interface bus is ensured with high reliability.

Figure 2E:
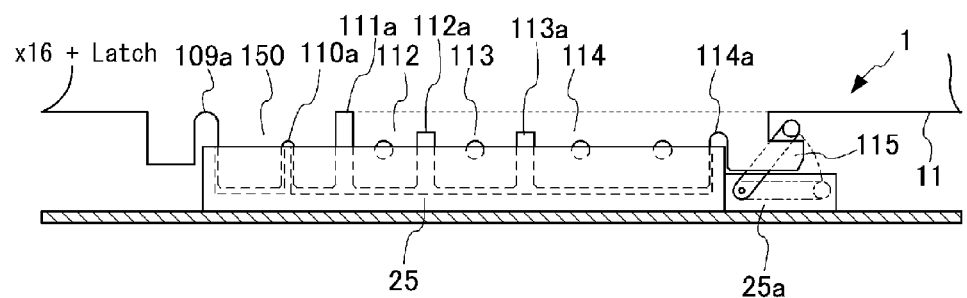
FIG. 2E is a view showing connecting states between the connecting device shown in FIG. 1 and a 16-lane interface bus sockets.

Referring now to FIG. 2E, the connection between the connecting device 1 and the 16-lane interface bus with the latch portion 25a is described. As shown in FIG. 2E, the electrical connection portion 150 and the dummy contacts 112, 113, and 114 of the connecting device 1 fit into the socket 25 in the 16-lane interface bus, and, at the same time, the connecting device 1 electrically connects the interface bus and the electronic device. This is substantially the same as the configuration as described with reference to FIG. 2D, but further provides engagement between the engagement portion 115 and the latch portion 25a, and thus the mechanical connection between the connecting device 1 and the socket 25 in the interface bus is further improved.

It can be seen from the above description that the present embodiment of the connecting device 1, provided with the dummy contacts 112-114 and the engagement portion 115, is connectable to various types of interface buses such as the 1-lane interface bus, the 4-lane interface bus, the 8-lane interface bus, the 16-lane interface bus, and the 16-lane interface bus with the latch portion. However, various electronic components and the like may be attached around the socket in the interface bus, and thus connection may be difficult due to the presence of these electronic components and the like provided close to the socket, blocking or impeding the dummy contacts 112-114 or the engagement portion 115. In order to address this problem, the dummy contacts 112-114 and the engagement portion 115 in the present embodiment are configured such that these portions can be removed according to the shape of the socket in the interface bus to be connected.

Figure 3A:
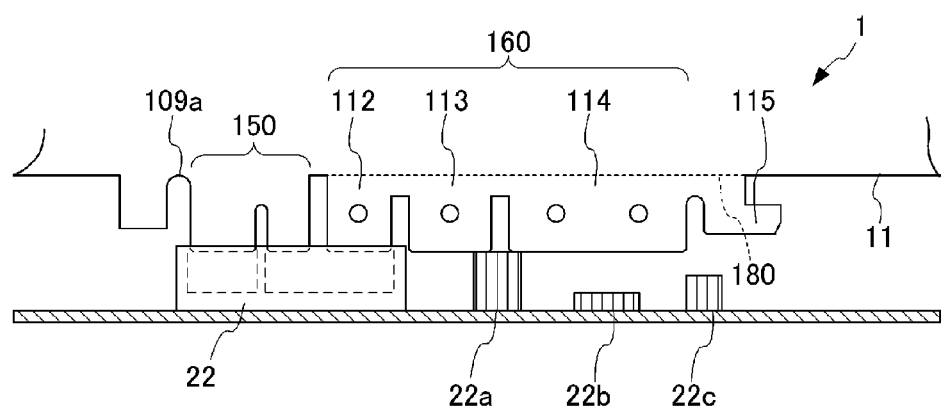
FIG. 3A is a view describing a connection between the connecting device shown in FIG. 1 and an interface bus socket having protrusions formed thereon.
Figure 3B:
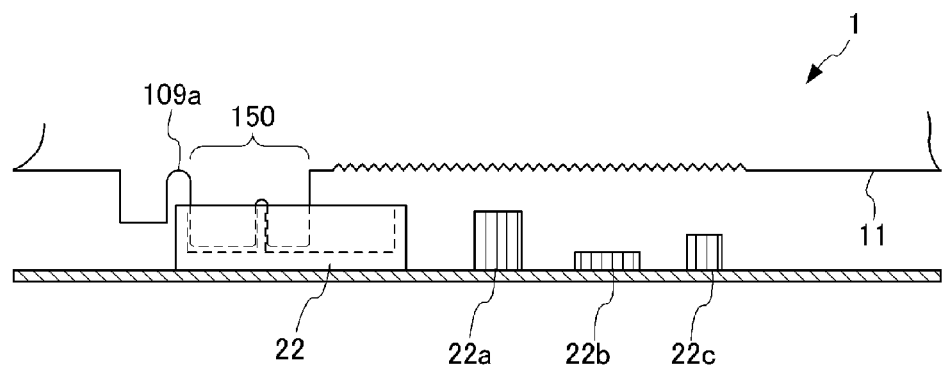
FIG. 3B is a view describing a connection between the connecting device shown in FIG. 1 and an interface bus socket having protrusions formed thereon.

Referring now to FIG. 3A and FIG. 3B, a case where protrusions 22a-22c are provided due to the electronic components and the like around the socket 22 in the 4-lane interface bus is described.

As shown in FIG. 3A, although the electrical connection portion 150 and the dummy contact 112 of the interface portion 1 can fit into the socket 22 in the 4-lane interface bus, a high reliability mechanical connection with the interface bus cannot be ensured because the protrusion 22a is in contact with the dummy contacts 113 and 114. In such a case, because the connection reinforcing portion in the present embodiment is provided with the break line 180, the portions that are in contact with the protrusions 22a-22c provided around the socket can be removed by breaking along the break line 180.

FIG. 3B shows the connecting device 1 in which the fitting portion 160 and the engagement portion 115 are removed by breaking along the break line 180. With the removal of the fitting portion 160 and the engagement portion 115, the protrusions 22a-22c provided around the socket 22 no longer conflict with any portion of the connecting device 1. As a result, the mechanical connection between the connecting device 1 and the socket 22 in the interface bus is ensured with high reliability. Further, although not shown in the drawings, additional strength to the mechanical connection with the interface bus may be provided by bringing one or both of the leading edge 13 and the trailing edge 14 of the connecting device 1 into abutting contact with a part of a housing portion (not depicted) that accommodates the interface bus, or, for example, by screwing the same to the housing portion.

Although the present embodiment of the connecting device has been described by taking the 1-lane connecting device as an example, the present invention can be applied to a 4-lane or 8-lane connecting device. In the following, the 4-lane and 8-lane connecting devices are described in brief.

4-Lane Type Connecting Device

Figure 4:
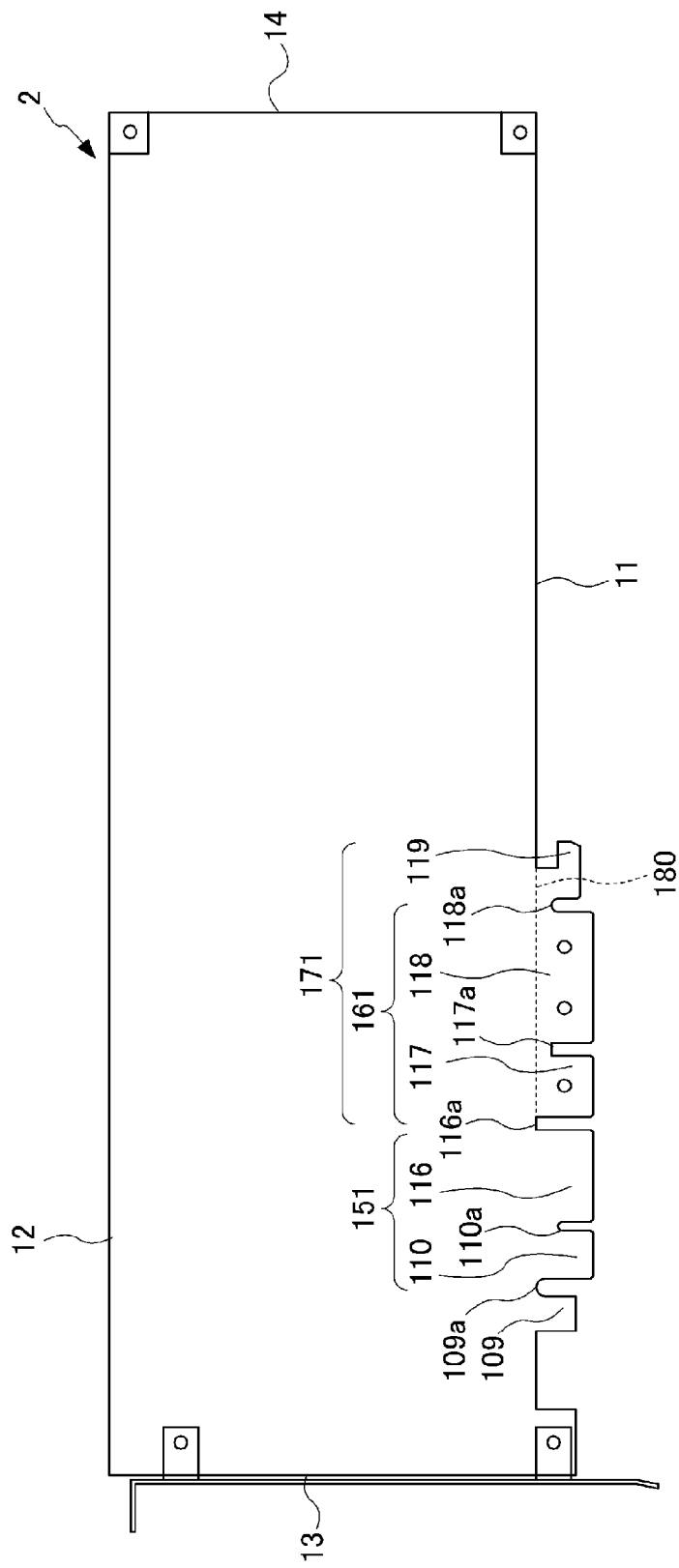
FIG. 4 is a view showing a connecting device similar to the connecting device shown in FIG. 1 but of a 4-lane type.

A 4-lane connecting device 2 is now described with reference to FIG. 4. The present embodiment of the connecting device 2 is substantially the same as the connecting device 1 of a 1-lane type described with reference to FIG. 1 to FIG. 3B, except that the connecting device 2 is a 4-lane type. Similar components are designated by the same reference numerals and detailed descriptions are omitted, with only differences being described.

The present embodiment of the connecting device 2 includes a bottom edge 11, a top edge 12, a leading edge 13, and a trailing edge 14. The bottom edge 11 is provided with a protrusion 109, contacts 110 and 116 that fit into a socket in an interface bus (not depicted) to electrically connect the interface bus and the electronic device (not depicted), dummy contacts 117 and 118 that fit into the socket in the interface bus and provide additional strength to a mechanical connection with the interface bus without providing an electrical connection between the interface bus and the electronic device, and an engagement portion 119 that engages with a latch portion in the interface bus to provide additional strength to the mechanical connection with the interface bus. A third insection 116a is provided between the contact 116 and the dummy contact 117, a fourth insection 117a is provided between the dummy contacts 117 and 118, and a fifth insection 118a is provided between the dummy contact 118 and the engagement portion 119. The contacts 110 and 116 constitute an electrical connection portion 151 according to the present invention, and the dummy contacts 117 and 118 constitute a fitting portion 161. Further, the dummy contacts 117 and 118 and the engagement portion 119 together constitute a connection reinforcing portion 171. Further, additional strength to the mechanical connection with the interface bus may be provided by bringing one or both of the leading edge 13 and the trailing edge 14 of the connecting device 2 into abutting contact with a part of a housing portion (not depicted) that accommodates the interface bus, or, for example, by screwing the same to the housing portion. In this case, according to the shape of the corresponding interface bus, one or both of the leading edge 13 and the trailing edge 14 which abut(s) the housing portion constitute(s) an abutting portion.

3. 8-Lane Type Connecting Device

Figure 5:
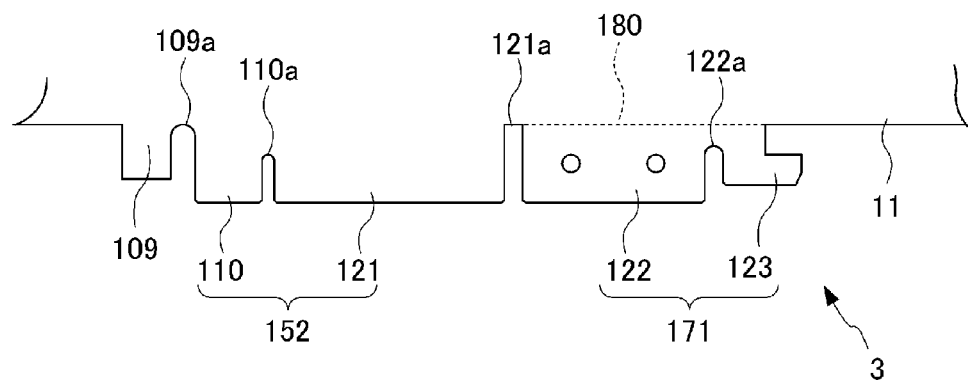
FIG. 5 is a view showing a connecting device similar to the connecting device shown in FIG. 1 but of an 8-line type.

An 8-lane connecting device 3 is now described with reference to FIG. 5. The present embodiment of the connecting device 3 is substantially the same as the connecting device 1 of a 1-lane type described with reference to FIG. 1 to FIG. 3B, except that the connecting device 2 is an 8-lane type. Similar components are designated by the same reference numerals and detailed descriptions are omitted, with only differences being described.

The present embodiment of the connecting device 3 includes a bottom edge 11, a top edge 12, a leading edge 13, and a trailing edge 14. The bottom edge 11 is provided with a protrusion 109, contacts 110 and 121 that fit into a socket in an interface bus (not depicted) to electrically connect the interface bus and the electronic device (not depicted), a dummy contact 122 that fits into the socket in the interface bus and provides additional strength to a mechanical connection with the interface bus without providing an electrical connection between the interface bus and the electronic device, and an engagement portion 123 that engages with a latch portion in the interface bus to provide additional strength to the mechanical connection with the interface bus. A third insection 121a is provided between the contact 121 and the dummy contact 122, and a fourth insection 122a is provided between the dummy contact 122 and the engagement portion 123. The contacts 110 and 121 constitute an electrical connection portion 152, and the dummy contact 122 constitutes a fitting portion, according to the present invention. Further, the dummy contact 122 and the engagement portion 123 together constitute a connection reinforcing portion 171. Further, additional strength to the mechanical connection with the interface bus may be provided by bringing one or both of the leading edge 13 and the trailing edge 14 of the connecting device 3 into abutting contact with a part of a housing portion (not depicted) that accommodates the interface bus, or, for example, by screwing the same to the housing portion. In this case, according to the shape of the corresponding interface bus, one or both of the leading edge 13 and the trailing edge 14 which abut(s) the housing portion constitute(s) an abutting portion.

As described above, the present embodiment of the connecting device includes the electrical connection portion that fits into the interface bus to electrically connect the electronic device and the interface bus, and the connection reinforcing portion that provides additional strength to the mechanical connection with the interface bus. Because the connection reinforcing portion is at least partially removable depending on the type, such as a bus width, of the interface bus, it is possible to ensure a highly reliable electrical connection with the electronic device even for an interface bus of a different type, without complicating the configuration and increasing the cost.

In the present embodiment, the break line is provided in the portions where the fitting portion and the engagement portion are provided, and, if necessary, the fitting portion and the engagement portion are entirely removed by breaking along the break line. However, the present invention is not limited to such an example. Assuming a case where the corresponding socket in the interface bus is provided with a latch, for example, the break line may be provided only for the fitting portion, leaving the engagement portion intact. Alternatively, the fitting portion may be partially removable. In other words, the break line may be provided so as to remove one of, or a part of, the fitting portion 160 and the engagement portion 115, depending on the shape of the socket in the interface bus that is assumed. This will be described in relation to the following embodiment.

Second Embodiment

Figure 6:
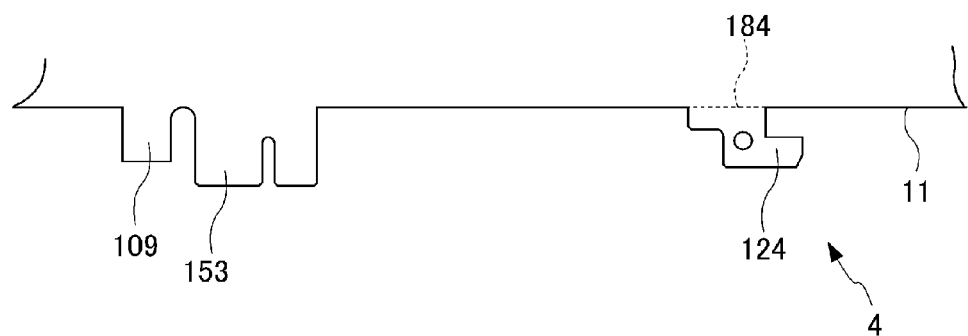
FIG. 6 is a view showing a second embodiment of a connecting device according to the present invention.

The following describes a second embodiment of a connecting device according to the present invention with reference to FIG. 6. For example, the present embodiment of a connecting device 4 constituted as an adapter card mounting an electronic device includes an electrical connection portion 153, is of a 1-lane type, and is provided only with an engagement portion 124 removable along a break line 184, with no fitting portion. The connecting device 4 can be applied to the socket of 1-lane, 4-lane, 8-lane, or 16-lane type, if the socket in the interface bus is provided with a latch portion. With such a configuration, even if there are protrusions around the socket in the interface bus due to electronic components and the like, a highly reliable connection between the electronic device and the interface bus can be ensured. Further, although not shown in the drawings, additional strength to the mechanical connection with the interface bus may be provided by bringing one or both of a leading edge 13 and a trailing edge 14 of the connecting device 4 into abutting contact with a part of a housing portion (not depicted) that accommodates the interface bus, or, for example, by screwing the same to the housing portion. Although the 1-lane type connecting device has been described in the present embodiment, any of 4-lane, 8-lane, and 16-lane type connecting devices can also be applied to sockets of different types in the interface bus, if the connecting device has the same configuration and is provided only with the engagement portion that is removable, without the fitting portion being provided.

Third Embodiment

Figure 7:
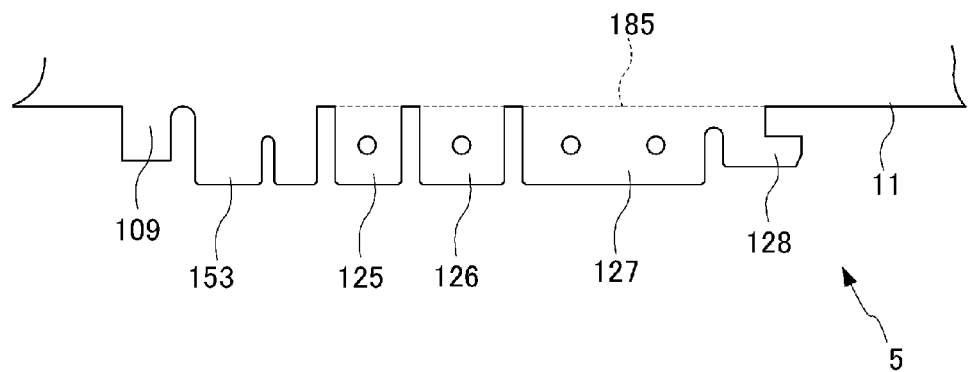
FIG. 7 is a view showing a third embodiment of a connecting device according to the present invention.

The following describes a third embodiment of a connecting device according to the present invention with reference to FIG. 7. For example, the present embodiment of a connecting device 5 constituted as an adapter card mounting an electronic device includes an electrical connection portion 153, is of a 1-lane type, and is provided with a fitting portion constituted from dummy contacts 125, 126, and 127 and an engagement portion 128 such that each of the dummy contacts 125, 126, and 127 and the engagement portion 128 can be removed separately along a break line 185. The connecting device 5 can be applied to a socket of a 1-lane, 4-lane, 8-lane, or 16-lane type if the socket in the interface bus is provided with a latch portion. Moreover, even if there are protrusions around the socket in the interface bus due to electronic components and the like, regardless of the presence of the latch portion, a highly reliable connection between the electronic device and the interface bus can be ensured by selectively removing the fitting portion and the engagement portion at the corresponding portion along the break line 185. Further, although not shown in the drawings, additional strength to the mechanical connection with the interface bus may be provided by bringing one or both of a leading edge 13 and a trailing edge 14 of the connecting device 5 into abutting contact with a part of a housing portion (not depicted) that accommodates the interface bus, or, for example, by screwing the same to the housing portion. Although the 1-lane type connecting device has been described in the present embodiment, any of 4-lane, 8-lane, and 16-lane type connecting devices can also be applied to sockets of different types in the interface bus, if the connecting device has the same configuration and is provided only with the engagement portion that is removable, without the fitting portion being provided.

Fourth Embodiment

Figure 8:
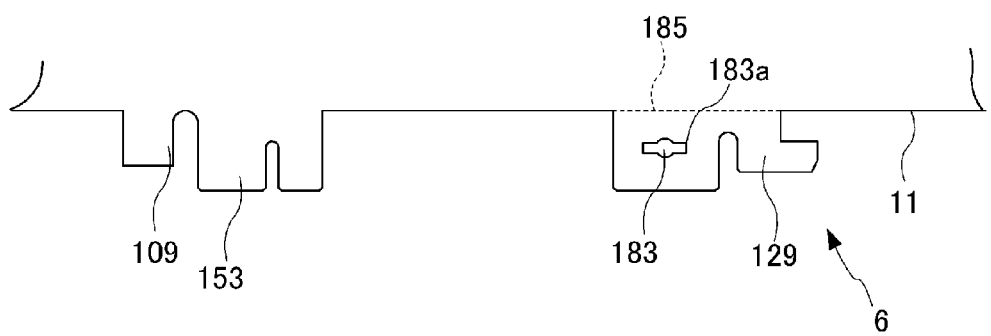
FIG. 8 is a view showing a fourth embodiment of a connecting device according to the present invention.
Figure 9:
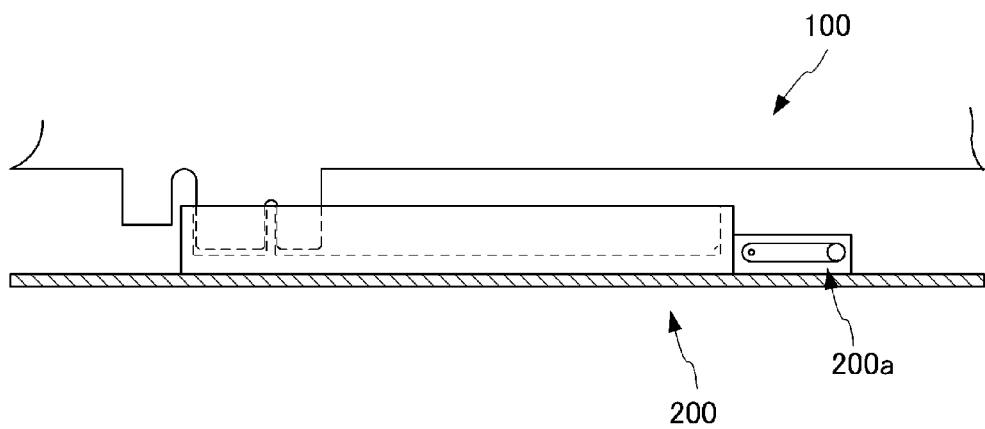
FIG. 9 is a view showing a problem that occurs when a conventional adapter card is inserted into an interface bus socket of a different specification.

The following describes a fourth embodiment of a connecting device according to the present invention with reference to FIG. 8. For example, the present embodiment of a connecting device 6 constituted as an adapter card installed in an electronic device includes an electrical connection portion 153, is of a 1-lane type and, and is provided with a slit 183a in an opening 183 provided for an engagement portion 129 such that the slit 183a is substantially parallel to a bottom edge 11, and a tip of a tool such as a slotted screwdriver can be easily inserted in this slit 183a. With this configuration, the engagement portion 129 can be easily removed along the break line 185 using a common tool such as a flat-head screwdriver, without a special tool being required. Clearly, in place of the flat-head screwdriver, a rod-shaped member may be utilized. Although in the present embodiment a configuration with an insection of such a shape is provided for the engagement portion 129 for ease of explanation, the present invention is not limited to this example, and an insertion of such a shape may be provided in an opening formed at any region.

In the above described embodiments according to the present invention, the connecting device that can be applied to the socket in the interface bus compliant with the PCI Express specification is explained for each lane specification. However, one of ordinary skill in the art will appreciate that the present invention is not limited to the PCI Express specification and the above-described lane specification, and can be applied to connections between sockets with the same shape and electronic devices, as long as the functional configuration is the same. In other words, while the above described embodiments of a connecting devices can be realized as an adapter card compliant with the PCI Express specification, the present invention is not limited to the PCI Express specification, and is applicable to, for example, bus devices with a plurality of bus widths including 32-bit bus devices and 64-bit bus devices compliant with the PCI specification. Further, the present invention is not limited to such a card and can be applied to any electronic component or electronic part that has the above configuration.

As described above, although the present invention is described with reference to the specific embodiments, the present invention is not limited to these embodiments. Moreover, the effects of the present invention as described in these embodiments are merely a list of preferred effects resulting from the present invention; the effects of the present invention are not limited to those described in the embodiments, and the features described in each embodiment may be used independently or in combination with the different features described in the different embodiments.

The invention claimed is:

1. A card used by being mechanically connected with a socket of an interface bus of a type selectable from among a plurality of bus widths, the card comprising:
   an electrical connection portion to be electrically connected with the socket of the interface bus; and
   a connection reinforcing portion to reinforce a mechanical connection with the socket of the interface bus, wherein the connection reinforcing portion is at least partially removable from the card, and further wherein the connection reinforcing portion includes dummy contacts.

2. A card as set forth in claim 1, wherein the connection reinforcing portion includes a fitting portion capable of being selectively fitted into the socket of the interface bus and removed.

3. A card as set forth in claim 1, wherein the connection reinforcing portion includes an engagement portion capable of being selectively engaged with the socket of the interface bus and removed.

4. A card as set forth in claim 1, wherein the connection reinforcing portion is removable by breaking along a break line.

5. A card as set forth in claim 4, wherein an opening into which a member can be inserted is formed in the connection reinforcing portion.

6. A card as set forth in claim 1, further comprising an abutting portion which abuts a part of housing that accommodates the card, so as to reinforce a mechanical connection with a socket of the interface bus.

7. A card as set forth in claim 1, wherein the electrical connection portion and the connection reinforcing portion are substantially in alignment with each other along an edge of the card.

8. A card as set forth in claim 1, wherein the interface bus is compliant with the PCI Express specification and the plurality of bus widths include a I-lane type interface bus width, a 4-lane type interface bus width, an 8-lane type interface bus width, and a I6-lane type interface bus width.

9. A card as set forth in claim 1, wherein the interface bus is compliant with the PCI specification and the plurality of bus widths include a 32-bit bus width and 64-bit bus width.

10. A connecting device used by being mechanically connected with a socket of an interface bus of a type selectable from among a plurality of bus widths is selectable, the connecting device comprising:
   an electrical connection portion to be electrically connected with the socket of the interface bus; and
   a connection reinforcing portion to a reinforce mechanical connection with the socket of the interface bus, wherein the connection reinforcing portion is at least partially removable from the connecting device, and further wherein the connection reinforcing portion includes dummy contacts.

\* \* \* \* \*